United States Patent
Rodmacq et al.

[11] Patent Number: 6,165,329
[45] Date of Patent: Dec. 26, 2000

[54] MULTILAYER MAGNETIC TRANSDUCER AND STRUCTURE HAVING A HIGH MAGNETORESISTANCE AND PROCESS FOR THE PRODUCTION OF THE STRUCTURE

[75] Inventors: Bernard Rodmacq, Le Versoud; André Pierrot, Sassenage, both of France; Philippe Gerard, St. Ismier, Belgium; Jean Mouchot, Grenoble, France

[73] Assignee: Commissariat a l'Energie Atomique, Paris, France

[21] Appl. No.: 09/322,080

[22] Filed: May 27, 1999

Related U.S. Application Data

[62] Division of application No. 08/160,204, Dec. 2, 1993, abandoned.

[30] Foreign Application Priority Data

Dec. 3, 1992 [FR] France .................................. 92 14557

[51] Int. Cl.[7] .......................... G01R 33/06; H01F 10/08; C23C 14/34
[52] U.S. Cl. ................................. 204/192.2; 204/192.12; 204/192.15; 204/298.12; 204/298.13; 427/576; 427/597; 427/128; 427/129; 427/131; 427/132
[58] Field of Search .......................... 204/192.11, 192.12, 204/191.15, 192.2, 298.12, 298.13; 427/576, 906, 597, 128, 129, 131, 132

[56] References Cited

U.S. PATENT DOCUMENTS

| | | | |
|---|---|---|---|
| 4,949,039 | 8/1990 | Grünberg . | |
| 5,134,533 | 7/1992 | Friedrich et al. | 360/113 |
| 5,277,991 | 1/1994 | Satomi et al. | 428/611 |
| 5,688,380 | 11/1997 | Koike et al. | 204/192.2 |
| 5,795,663 | 8/1998 | Koike et al. | 204/192.2 |

FOREIGN PATENT DOCUMENTS

| | | |
|---|---|---|
| 0 442 407 A1 | 11/1991 | European Pat. Off. . |
| 0 498 640 A2 | 5/1992 | European Pat. Off. . |
| 0 526 044 | 2/1993 | European Pat. Off. . |
| 600794 A1 | 6/1994 | European Pat. Off. . |
| 600794 B1 | 10/1999 | European Pat. Off. . |

OTHER PUBLICATIONS

Nguyen–Van–Dau et al, Revue Phys. Appl., 25 pp. 971–976, Oct. 1990.
Araki et al, Journal of the Physical Society of Japan, 60(9), pp. 2827–2830. Sep. 1991.
Rodmacq, J. Appl. Phys. 70(8), pp. 4194–4201, Oct. 1991.
F. Nguyen–Van–Dau et al., "Recent advaances in molecular beam epitaxy of metalliic multilayers and superlattices," Reveu Phys. Appl. 25 (1990) 971–976. (Month Unkown).
B. Dieny et al., "Giant magnetoresistance in soft ferromagnetic multilayers," Physical Review B: Condensed Matter 43 (1991) Jan. 1, No. 1, Part B, New York,, pp. 1297–1300.
S.S.P. Parkin, "Oscillations in giant magnetoresistance and antiferromagnetic coupling in $[Ni_{81}Fe_{19}/Cu]_N$ multilayers," Appl. Phys. Lett. 60 (4) Jan. 27, 1992, pp. 512–514.
D.H. Mosca et al., "Oscillatory interlayer coupling and giant magnetoresistance in Co/Cu multilayers," Journal of Magnetism and Magnetic Materials 94 (1991) L1–L5, North–Holland. (Month Unknown).
S.S.P. Parkin et al., "Oscillatory Magnetic Exchange Coupling through Thin Copper Layers," Physical Review Letters, vol. 66, No. 16, Apr. 22, 1991.

(List continued on next page.)

*Primary Examiner*—Alan Diamond
*Attorney, Agent, or Firm*—Burns, Doane, Swecker & Mathis, L.L.P.

[57] ABSTRACT

Multilayer magnetic transducer and structure and process for the production of the structure. The magnetic structure only has one stack of layers of a magnetic material separated by layers of a non-magnetic metallic material having a thickness such that there is an anti-ferromagnetic coupling between the magnetic layers, the magnetic material being chosen from among the alloys FeNi, FeNiCo, and NiCo and the non-magnetic material is silver.

18 Claims, 2 Drawing Sheets

OTHER PUBLICATIONS

S. Araki et al., "Giant Magnetoresistance and Oscillatory Magnetic Coupling of Evaporated and MBE–Grown Co/Ag Multilayers," Journal of The Physical Society of Japan, vol. 60, No. 9, Sep. 1991, pp. 2827–2830.

B. Rodmacq, "X–ray diffraction study of silver–nickel superlattices," J. Appl. Phys. 70 (8), Oct. 15, 1991. 4194–4201.

R. Nakatani et al., "Giant Magnetoresistance in Ni–Fe/Cu Multilayers Formed by Ion Beam Sputtering," IEEE Transactions on Magnetics, vol. 28, No. 5, Sep. 1992. pp. 2668–2670.

L.F. Schelp et al., "Co/Ag multilayer film: Role of annealing on the magnetic properties," Appl. Phys. Lett. (61) (15) Oct. 12, 1992. p. 1858–60.

MULTILAYER MAGNETIC TRANSDUCER AND STRUCTURE HAVING A HIGH MAGNETORESISTANCE AND PROCESS FOR THE PRODUCTION OF THE STRUCTURE

This application is a divisional of application Ser. No. 08/160,204, filed Dec. 2, 1993 now abandoned.

DESCRIPTION

The present invention relates to a metallic multilayer magnetic structure having a high magnetoresistance and to its production process. Throughout the present text, this structure will be referred to as MMMS.

This structure is more particularly intended for the production of transducers or sensors such as weak or low field transducers, magnetic recording heads (magnetoresistive reading), angular or linear decoders for the restoration of information coded in magnetic form in a random medium such as a magnetic strip, ticket, card, disk, etc. The invention also relates to magnetic transducers.

The MMMS's according to the invention can be used for the production of magnetic flux guides.

The known MMMS's are formed from a stack of magnetic metallic layers separated by non-magnetic metallic layers, in which the thickness of the non-magnetic layers is such that there is an anti-ferromagnetic coupling between the magnetic layers. Under the effect of a magnetic field applied to the structure, the rotation of the anti-parallel state to the parallel state of the magnetizations of each of the magnetic layers is accompanied by a reduction in the electrical resistance of the structure, i.e. the magnetoresistive effect.

Thus, by measuring the resistance of the structure, it is possible to measure a magnetic field and conversely measure an electrical resistance by measuring a magnetic field.

Thus, the saturation magnetic field Hs is defined as being the magnetic field applied to the structure which is adequate for orienting parallel to one another the magnetization of each of the magnetic layers, initially anti-parallel in the absence of a field.

In a MMMS traversed by a uniform current and having anti-ferromagnetic couplings, the magnetoresistance MR is defined as being the ratio $$\Delta\rho/\rho = \frac{[\rho(H=0) - \rho(H=Hs)]}{\rho(H=0)}$$

in which H represents the value of the field applied, $\rho(H=0)$ is the resistivity of the MMMS in zero field and $\rho(H=Hs)$ its resistivity when a magnetic field is present which is equal to the saturation field. In addition, $\Delta\rho/\rho = \Delta R/R$ with R representing the resistance of the MMMS.

The sensitivity of the magnetoresistive structure and therefore that of a magnetoresistive effect transducer are defined by the magnetoresistance variation obtained by applying a unitary magnetic field and it satisfies the relation:

$$\alpha = (d(\Delta R/R)/dH)_{H<Hs}.$$

Moreover, the thickness of the magnetic and non-magnetic layers must be finely adjusted so as to obtain a magnetoresistance maximum, i.e. the highest possible value of $\Delta R/R$, for the lowest possible saturation field.

Multilayer structure magnetoresistive effect transducers or sensors are in particular described in EP-A-442 407 (ref. 1), FR-A-2 648 942 (ref. 2) and U.S. Pat. No. 4,949,039 (ref. 3).

Constructional examples of magnetoresistive multilayer structures are also described in the documents:

Physical Review B, vol. 44, No. 10, September 1991, "Oscillatory interlayer exchange and magnetoresistance in Fe/Cu multilayers" by F. Petroff et al, pp 5355–5357 (ref. 4);

Appl. Phys. Lett. 60(4), January 1992, "Oscillations in giant magnetoresistance and antiferromagnetic coupling in $(Ni_{81}Fe_{19}/Cu)_n$ multilayers", by S. S. P. Parkin, pp 512–514 (ref. 5);

Journal of Magnetism and Magnetic Materials 94 (1991), L1–L5, "Oscillatory interlayer coupling and giant magnetoresistance in Co/Cu multilayers" by D. H. Mosca et al (ref. 6);

Physical Review Letters, vol. 66, No. 16, April 1991, "Oscillatory magnetic exchange coupling through thin copper layers" by S. S. P. Parkin et al, pp 2152–2155 (ref. 7);

Journal of the Physical Society of Japan, vol. 60, No. 9, September 1991, pp 2827–2830 "Giant magnetoresistance and oscillatory magnetic coupling of evaporated and MBE-grown Co/Ag multilayers" by S. Araki et al (ref. 8);

J. Appl. Phys. 70(8), October 1991, "X-ray diffraction study of silver-nickel superlattices" by B. Rodmacq, pp 4194–4201 (ref. 9);

IEEE Transactions on magnetics, vol. 28, No. 5, September 1992, "Giant magnetoresistance in Ni—Fe/Cu multilayers formed by ion beam sputtering" by R. Nakatani et al, pp 2668–2670 (ref. 10);

Appl. Phys. Lett. 61(15), October 1992, "Co/Ag multilayer film: role of annealing on the magnetic properties" by L. F. Schelp et al, pp 1858–1860 (ref. 11).

The magnetic materials mainly used in multilayer structures are iron (cf. references 1 to 4 and 7), iron and nickel Fe—Ni alloys (cf. references 3, 5 and 10), cobalt (cf. references 1, 6 to 8 and 11) and nickel (cf. reference 9).

The non-magnetic materials used in magnetic multilayer structures must have a high electrical conductivity. Use is most frequently made of copper (cf. references 1, 4 to 7 and 10). Consideration has also been given to chromium (references 2 and 4), gold (cf. references 3 and 5), ruthenium (cf. references 4 and 6) and more recently silver (cf. references 8, 9 and 11).

Certain MMMS's have a magnetic hysteresis, so that for a transducer having these structures, there are instability possibilities during high external magnetic disturbances or interference. This is particularly the case for the multilayer structures of references 6 and 11.

Moreover, in this particular application of transducers, multilayer magnetic structures will necessarily undergo, during subsequent transducer manufacturing stages, thermal cycles which can extend up to 300° C.

Thus, the production of the transducers requires the stacking of layers of different types, namely insulating, conductive, magnetic, etc., which are deposited at often high temperatures on the MMMS's.

For the presently known structures, these thermal cycles lead to a reduction of the magnetoresistance (cf. references 5 and 7), as well as to a stability or an increase in the magnetic saturation field (cf. reference 5). However, reference 11 describes a magnetoresistance which increases with the annealing process, but the properties obtained do not permit its use in weak or low field transducers.

Moreover, the production of transducers from these known structures can only take place to the extent where they are able to resist temperatures between 150 and 300° C. In the case of NiFe/Cu structures (reference 5), thermal treatments at 150° C. have led to a significant reduction in the magnetoresistance without any significant modification to the saturation field.

It is therefore necessary to find a new multilayer magnetic structure for transducers, able to withstand thermal cycles up to 300° C.

In addition, certain of the known multilayer structures (cf. references 4, 6, 8 and 11) have excessively high coercive fields (above 800 A/m, i.e. approximately 10 Oe) to permit their use in a transducer. Other structures (cf. reference 9) either have an inadequate magnetoresistance or an excessive saturation field (references 4, 7 to 11) or both at once, together with a much too low magnetic permeability (below 200). The anti-ferromagnetic coupling between the magnetic layers has hitherto led to excessive saturation fields Hs.

The invention therefore relates to a multilayer magnetic structure not having the aforementioned disadvantages. In particular, this structure is usable in a magnetoresistive transducer and has good magnetic characteristics, which do not deteriorate and which are even improved when it undergoes annealing at above 150° C.

None of the presently known multilayers structures having acceptable magnetic properties are subject to any improvement in the magnetic properties when such an annealing is carried out.

In order to obtain a multilayer magnetic structure not suffering from the problems referred to hereinbefore, it is necessary to limit the miscibility between the magnetic layers and the non-magnetic layers. Thus, the optimum thickness of the non-magnetic layer leading to the anti-ferromagnetic coupling is very low (approximately 1 nm), so that it is necessary to avoid a high direct ferromagnetic coupling between the magnetic layers, e.g. due to the non-continuity of the non-magnetic layers and to chemical mixing appearing at the temperatures reached during the manufacture of the transducer using this structure.

Thus, the principle used in the invention is the non-miscibility between the non-magnetic metallic layers and the magnetic layers.

To this end, the invention relates to a metallic multilayer magnetic structure formed from a stack of magnetic material layers separated by non-magnetic material layers, characterized in that the magnetic material is an alloy chosen from among FeNi, FeNiCo and NiCo and the non-magnetic material is silver.

The iron composition of these alloys is $\leq 50$ atomic %.

In particular for FeNi, a choice is made of an alloy having 50 to 99 atomic % Ni and 1 to 50 atomic % iron. Preferably, use is made of a FeNi alloy having less than 90 atomic % nickel and typically the alloy $Fe_{19}Ni_{81}$ is used.

The number of magnetic layers of the structure can vary from 2 to 5000 as a function of the envisaged application (type of transducer, flux guide).

The thickness of each magnetic layer can vary from 0.5 to 50 nm and preferably 1 to 2 nm. The thickness of the silver layers is advantageously 0.5 to 5 nm.

The magnetic and non-magnetic layers are deposited on a random substrate, e.g. of monocrystalline or polycrystalline silicon, gallium arsenide, glass, plastic, polymer and even metal covered with an electrical insulant.

The invention also relates to a process for the production of a multilayer magnetic structure as described hereinbefore.

According to an essential feature of this process, the magnetic and non-magnetic layers are deposited by the condensation of metal vapours on a substrate at a temperature below ambient temperature. Preference is given to the use of cathodic sputtering, but evaporation is also usable.

Typically, the deposit is made at a temperature from −196 to −50° C. and preferably between −196 and −150° C.

This process permits a better segregation between the magnetic and non-magnetic layers and therefore a non-miscibility of said layers.

For a deposit made at a temperature equal to or higher than ambient temperature, undesirable effects occur such as the formation of small magnetic material grains in the silver, as well as the non-maintenance of discontinuities between layers.

The materials used, as well as the deposition process make it possible to obtain multilayer structures having excellent magnetic properties such as:

a high magnetoresistance exceeding 0.15, a low saturation field below 400 Oe (approximately 32 kA/m), a quasi-zero hysteresis below 1 Oe (approximately 80 A/m), a linear response over the entire magnetic field range up to H=Hs, a high magnetic permeability (above 200), at a temperature of approximately 20° C.

Most of the presently known multilayer structures do not have all these characteristics. Thus, most of the structures have an inadequate magnetoresistance or an excessive saturation field, e.g. the structures described in references 4 and 7 to 11. Others have an excessive hysteresis, e.g. those of references 6 and 11.

Only the $Fe_{19}Ni_{81}$/Cu structure of reference 5 has these characteristics, but its performance characteristics are reduced by annealing at a temperature of 150 to 300° C. necessary for the production of a thin film transducer.

Unlike all the hitherto considered multilayers systems, the performance characteristics of the multilayer structure according to the invention are good and improve with the annealing.

Thus, the magnetoresistance increases up to a critical temperature between 150 and 300° C. as from which it decreases, said critical temperature being a function of the thickness of the layers used. The saturation field decreases when the temperature increases. Following annealing, the hysteresis remains low (below 1 Oe) and the linear response is maintained.

Moreover, after annealing, there is a significant permeability increase, which is particularly interesting for the use of said structure in a transducer.

Thus, advantageously, the magnetic structure undergoes annealing at between 150 and 300° C. The annealing temperature used is a function of the thickness of the different layers used.

The magnetic structures obtained in this way are of interest both for use as sensitive, permeable magnetoresistances for transducers, and as magnetic flux guides.

The invention also relates to a magnetoresistive effect multilayer transducer having a stack of magnetic material layers separated by non-magnetic material layers, characterized in that the magnetic material is an alloy chosen from among FeNi, FeNiCo and NiCo and the non-magnetic material is silver.

The invention is described in greater detail hereinafter relative to a non-limitative embodiment and with reference to the attached drawings, wherein show:

Figure 1:
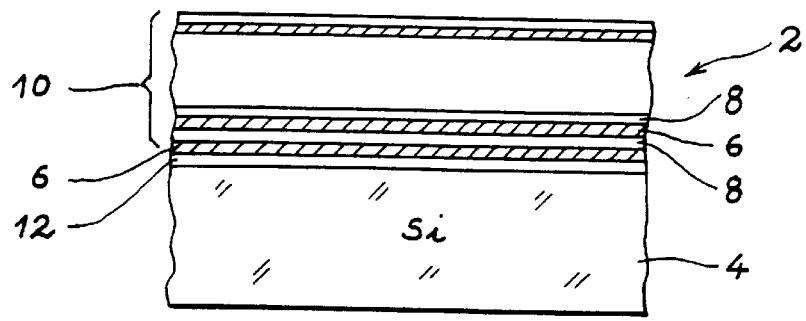
FIG. 1 Diagrammatically and in longitudinal section a multilayer structure according to the invention.

Reference sign 2 in FIG. 1 indicates in general terms the multilayer magnetic structure according to the invention. This structure has a silicon substrate 4 on which are alternately deposited silver layers 6 or FeNi, FeNiCo or CoNi alloy layers 8.

A magnetic (e.g. Fe—references 6 and 10) or non-magnetic ($SiO_2$ or $Si_3N_4$) attachment layer 12 can advantageously be deposited on the substrate 4 in order to improve the structural quality of the stack. The conducting layers 6 have a thickness of 0.5 to 5 nm and the magnetic layers 8 a typical thickness of 1 to 2 nm.

The stack 10 of magnetic layers and non-magnetic layers can contain 2 to 5000 layers, as a function of the envisaged application. For a reading head use is e.g. made of 220 1.2 nm thick FeNi layers and 220 1 nm thick Ag layers.

According to the invention, the layers 6 and 8 are deposited e.g. by cathodic sputtering, whilst maintaining the substrate 4 at a temperature of −196 to −50° C. and e.g. between −196 and −150° C.

Unlike those of the prior art, the magnetic structures according to the invention have a high magnetoresistance, a low coercivity (low Hc) and a high permeability after annealing at a temperature below 300° C. and which is a function of the thickness of the layers.

Thus, research has shown that for a stack of 200 layers constituted by alternating 1.2 nm thick FeNi layers and 1 nm thick silver layers, annealing at 290° C. leads to the obtaining of a soft material with a coercive magnetic field Hc of 0.5 Oe (approximately 40 A/m), a high sensitivity with =19 per MA/m and a high magnetic permeability with $\mu$=1500, for a frequency of 1 MHz.

Figure 2:
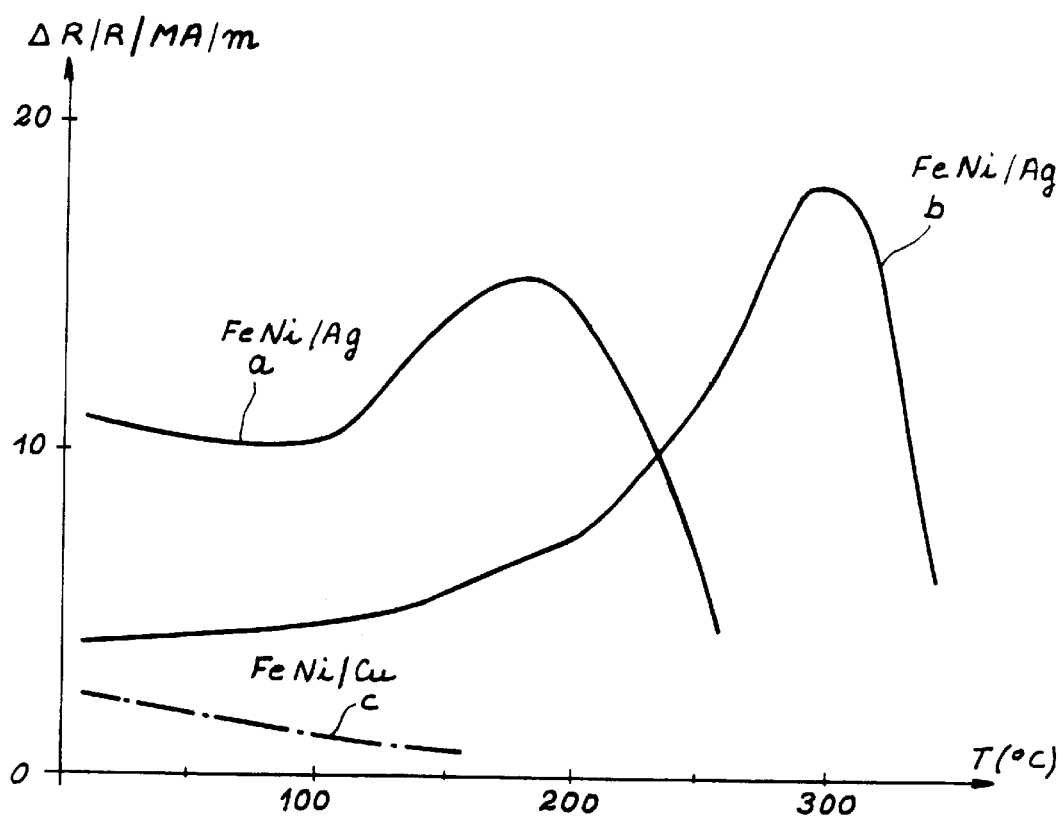
FIG. 2 The variations of the sensitivity ΔR/R by MA/m of multilayer structures according to the prior art and according to the invention, as a function of the temperature T in ° C.

For comparison purposes, FIG. 2 gives an evolution of the sensitivity of the different multilayer structures according to the invention and the prior art, as a function of the annealing temperature. These curves give the variations of ΔR/R per MA/m, as a function of the annealing temperature T in ° C. The sensitivity is measured after returning to ambient temperature.

The curve a relates to a stack of 200, respectively 1.6 and 1.3 nm $Fe_{19}Ni_{81}$/Ag layers. Curve b relates to a stack of 200 $Fe_{19}Ni_{81}$/Ag layers with respective thicknesses 1.2 and 1.1 nm. Curve c relates to a stack of 200 $Fe_{19}Ni_{81}$/Cu layers with respective thicknesses of 1.5 and 0.9 nm (cf. reference 5).

It can be seen that the sensitivity of the structures according to the invention increases with the annealing temperature up to a certain value, which is a function of the thickness of the respectively magnetic and non-magnetic layers, unlike what happens in the case of the prior art structures. Thus, annealing up to a certain value makes it possible to improve the sensitivity of the structures according to the invention.

The influence of this thermal annealing is also apparent in the following table, which gives the magnetoresistance ΔR/R and the value of the saturation magnetic field Hs for different annealing temperatures and different stacks.

On the basis of this table, it can be seen that the magnetoresistance decreases when the annealing temperature increases for the prior art structures, whereas it increases when the annealing temperature increases with structures according to the invention. Moreover, the annealing temperature virtually does not modify the saturation magnetic field for the prior art materials, whereas it is advantageously decreased for the structures according to the invention. Thus, contrary to all the known multilayer structures, FeNi/Ag, but also FeNiCo/Ag and NiCo/Ag structures have high performance characteristics, which improve after annealing.

Figure 3:
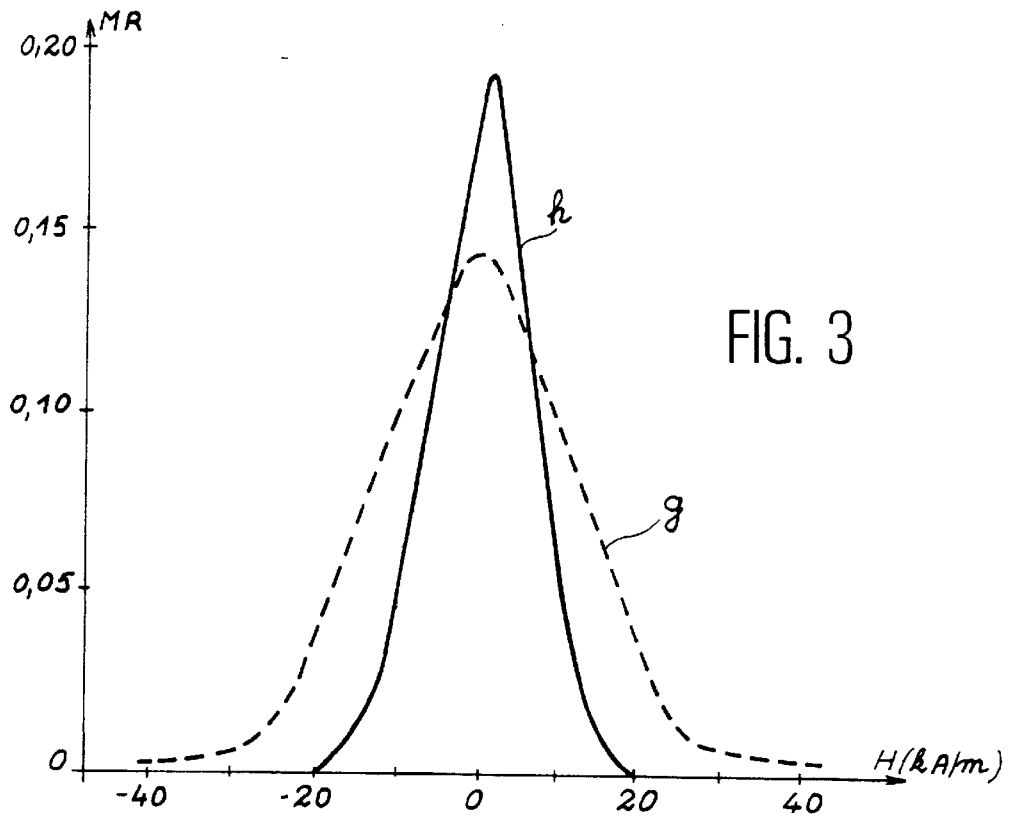
FIG. 3 Variations of the magnetoresistance MR before and after annealing a structure according to the invention, as a function of the magnetic field H applied, expressed in kA/m.

These unexpected results are made readily apparent in FIG. 3, which gives the variations of the magnetoresistance MR as a function of the magnetic field applied, for a $Fe_{19}Ni_{81}$/Ag structure at 20° C. in accordance with example 1. Curves g and h relate to variations of the magnetoresistance before and after annealing at 250° C.

These curves also show that the annealing permits an increase in the magnetoresistance and a decrease of the resistivity, a reduction of the saturation field, a still zero hysteresis, as well as a maintained linearity.

This improvement of the performance characteristics on annealing clearly indicates that the silver layers do not mix with the FeNi layers. The same applies with respect to NiCo/Ag and FeNiCo/Ag structures.

Further research made it possible to demonstrate that annealing significantly improves the magnetic permeability of the multilayer structure. Thus, with a 5 $\mu$m thick structure, 1.2 nm FeNi layers and 1.1 nm silver layers, there is a magnetic permeability of the untreated material $\mu$ after deposition of 50 at a frequency of 1 MHz. With annealing at around 290° C., the magnetic permeability exceeds 1500 for a weak coercive field around 40 A/m (i.e. 0.5 Oe). This effect of soft magnetic layers is very interesting for producing magnetic flux guides and for use as sensitive, permeable magnetoresistances.

Figure 4:
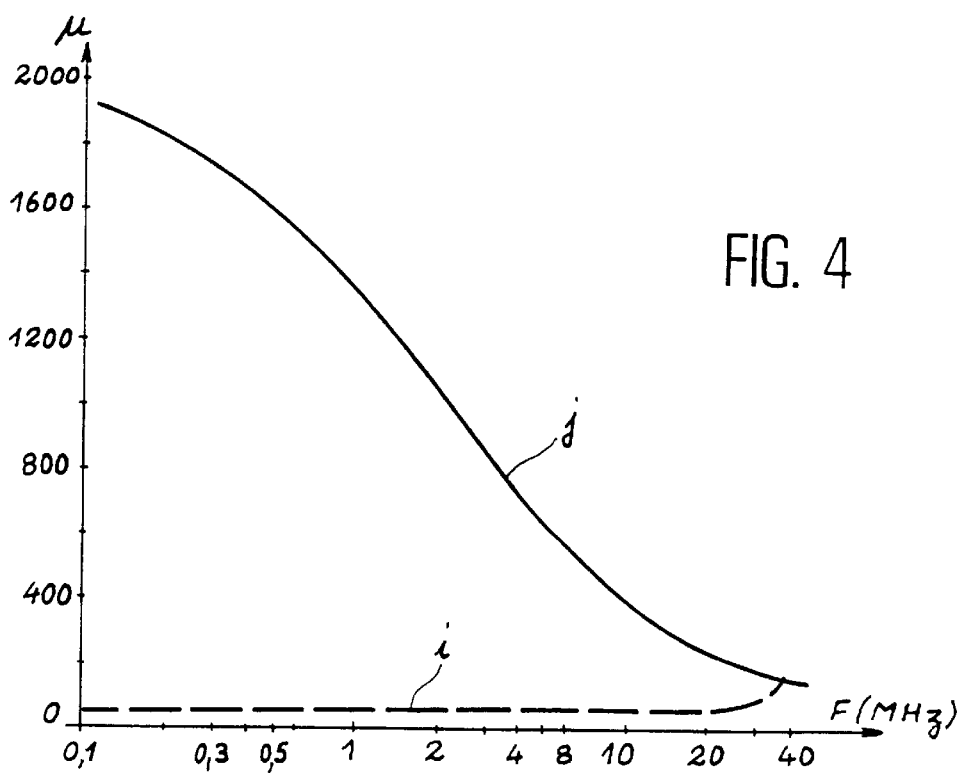
FIG. 4 The variations of the magnetic permeability $\mu$ before and after annealing in the case of a structure according to the invention, as a function of the magnetic frequency F applied, expressed in MHz.

This result is confirmed by FIG. 4, which gives the variations of the magnetic permeability as a function of the frequency F in MHz of the magnetic field applied. The curves i and j respectively relate to the magnetic permeability obtained before and after annealing. The studied structure is the same as that used for the layers of FIG. 3.

The obtaining of a strong magnetic permeability permits a better sensitivity of the magnetoresistive transducers by increasing the sensed magnetic flux.

Hitherto, noone has envisaged the use of FeNi/Ag, FeNiCo/Ag or NiCo/Ag structures, because their unexpected properties could not be forecast when compared with other multilayer structures.

Surprisingly, even on non-optimized magnetoresistive transducers, there are signal gains exceeding a factor of 10 compared with those produced with the prior art structures.

Thus, a FeNi/Ag magnetoresistive transducer was produced for the reading of informations stored in the form of magnetic domains in a magnetic disk. The magnetoresistive transducer was 1 mm long, 7 $\mu$m wide and 0.5 $\mu$m thick. The FeNi layers were 1.2 mm thick $Fe_{19}Ni_{81}$ layers and the silver layers were 1.1 nm thick. The zero field transducer resistance was 73 ohms and the total magnetoresistance (to pass from H=0 to H=Hs) was 10%. The substrate was made from silicon.

1.2 mm wide magnetic tracks were previously made in the disk using an inductive magnetic head.

The disk had the following properties: the product Mrδ was 560 gauss'μm (45 kA) with Mr representing the residual magnetization and δ the thickness of the magnetic field, whilst Hc was 800 Oe (63 A/m). The width of the magnetic domains was 50 μm and the disk travel speed 0.2 m/s.

Under these conditions and using a current of 35 milliamperes applied to the magnetoresistance, namely a current density of $10^6$ A/cm$^2$, a signal of 80 millivolts peak to peak was obtained.

Moreover, using the same magnetic structure as for the resistive transducer, a magnetic flux guide was produced. Its saturation magnetization was between 100 and 300 KA/m, its permeability was approximately 1000 at a frequency of 1 MHz and the magnetic hysteresis was below 1 Oe (79 A/m).

Thus, in the same deposition enclosure, it is possible to produce by cathodic sputtering from the same set of targets, a magnetoresistance and a flux guide concentrating the magnetic field lines in said magnetoresistance.

TABLE

| | SAMPLES | | ANNEALING | | | | | | | |
|---|---|---|---|---|---|---|---|---|---|---|
| | | Layer | Total | 20° C. | | 150° C. | | 200° C. | | 250° C. | |
| | Material | thickness nm | layer number | ΔR/R | Hs (kA/m) | ΔR/R | Hs (kA/m) | ΔR/R | Hs (kA/m) | ΔR/R | Hs (kA/m) |
| Counter-example | FeNi/Cu | 1.5/0.9 | 14 | 0.105 | 45 | 0.036 | 45 | not performed | | not performed | |
| Example | FeNi/Ag | 1.2/1.1 | 200 | 0.15 | 24 | 0.155 | 23 | 0.18 | 20 | 0.18 | 12 |

What is claimed is:

1. Process for the production of a multilayer metallic magnetic structure having only one stack of magnetic material layers that are separated by metallic, non-magnetic material layers with a thickness such that there is an antiferromagnetic coupling between the magnetic layers, which comprises depositing the magnetic and non-magnetic layers by the condensation of metal vapours on a substrate at a temperature below ambient temperature, said magnetic material being an alloy selected from the group consisting of FeNi, FeNiCo and NiCo and wherein the non-magnetic material is silver.

2. Process for the production of a multilayer metallic magnetic structure having only one stack of magnetic material layers that are separated by metallic, non-magnetic material layers with a thickness such that there is an antiferromagnetic coupling between the magnetic layers, which comprises depositing the magnetic and non-magnetic layers by cathodic sputtering on a substrate at a temperature below ambient temperature, said magnetic material being an alloy selected from the group consisting of FeNi, FeNiCo and NiCo and wherein the non-magnetic material is silver.

3. Process according to claim 1 comprising depositing the magnetic and non-magnetic layers at a temperature from −196 to −50° C.

4. Process according to claim 1 comprising depositing the magnetic and non-magnetic layers at a temperature from −196 to −150° C.

5. Process according to claim 2, comprising depositing the magnetic and non-magnetic layers at a temperature from −196 to −50° C.

6. Process according to claim 1 wherein the non-magnetic metallic layers are non-miscible with the magnetic material layers.

7. Process according to claim 1 wherein the magnetic material comprises FeNi.

8. Process according to claim 1 wherein the magnetic material contains 50–99 atomic % Ni and 1–50 atomic % iron.

9. Process according to claim 1 wherein the magnetic material is FeNi and contains 81 atomic % Ni.

10. Process according to claim 1 wherein the magnetic material layers each have a thickness of between 0.5 to 50 nm.

11. Process according to claim 1 wherein the non-magnetic metallic material layers each have a thickness of between 0.5 to 5 nm.

12. Process according to claim 1 wherein the substrate comprises material that is selected from the group consisting of monocrystalline silicon, polycrystalline silicon, gallium arsenide, glass, plastic, polymer, and metal that is covered with an electrical insulant.

13. Process according to claim 1 wherein the multilayer structure has a magnetoresistance greater than 0.15.

14. Process according to claim 1 wherein the multilayer structure has a saturation field of less than 400 Oe.

15. Process according to claim 1 wherein the multilayer structure has a quasi-zero hysteresis that is less than 1 Oe.

16. Process according to claim 1 wherein the multilayer structure has a magnetic permeability which is higher than 200, at a temperature of about 20° C.

17. Process according to claim 1 further comprising the step of depositing an attachment layer on the substrate surface prior to production of the stack multilayer metallic magnetic structure.

18. Process according to claim 1 further comprising the step of annealing the stack at a temperature from 150° to 300° C.

* * * * *